United States Patent [19]
Lim et al.

[11] Patent Number: 5,543,725
[45] Date of Patent: Aug. 6, 1996

[54] REUSABLE CARRIER FOR BURN-IN/TESTING ON NON PACKAGED DIE

[75] Inventors: Samuel S. S. Lim; Siew K. Tan, both of Singapore, Singapore

[73] Assignee: Sunright Limited, Singapore

[21] Appl. No.: 111,706

[22] Filed: Aug. 25, 1993

[51] Int. Cl.⁶ .................................................. G01R 31/02
[52] U.S. Cl. ........................................ 324/755; 324/765
[58] Field of Search ................................. 324/73.1, 750, 324/754, 765, 158.1; 361/411; 439/482, 61, 66, 92, 197; 257/40, 48; 437/8; 29/842

[56] References Cited

U.S. PATENT DOCUMENTS

| | | | |
|---|---|---|---|
| 4,288,841 | 9/1981 | Gogal | 361/414 |
| 4,750,092 | 6/1988 | Werther | 361/400 |
| 4,899,107 | 2/1990 | Corbett et al. | 324/158 |
| 4,899,109 | 2/1990 | Tropp et al. | 324/320 |
| 5,088,190 | 2/1992 | Malhi et al. | 29/843 |
| 5,123,850 | 6/1992 | Elder et al. | 439/67 |
| 5,302,891 | 4/1994 | Wood et al. | 324/765 |

FOREIGN PATENT DOCUMENTS

| | | |
|---|---|---|
| 1255810 | 6/1989 | Canada . |
| 1284862 | 6/1991 | Canada . |

*Primary Examiner*—Vinh P. Nguyen
*Attorney, Agent, or Firm*—Morgan & Finnegan, L.L.P.

[57] ABSTRACT

A re-usable carrier having a cavity for receiving unpackaged die with molded metallized probe heads to establish contact with the bond pads of the die, enabling the die to be functionally tested through the existing test systems. The novel carrier has metallized contacts for making electrical connection between the bare die and the perimeter of the carrier. The circuitry for electrically connecting the die and the perimeter of the carrier can be molded and plated into the base or printed on polymeric film. The base or integrated cover-base of the carrier may be thermoplastic molded to conform to any intended package for the die. The object is to adapt the carrier to the existing test equipment for burn-in stress and electrical tests for the intended package design without having to modify the hardware. The carrier may be plugged into a burn-in socket for burn-in stress testing and inserted onto an automatic test handler for electrical testing. Following burn-in stress and electrical tests, the die is removed and the carrier may be re-used.

13 Claims, 11 Drawing Sheets

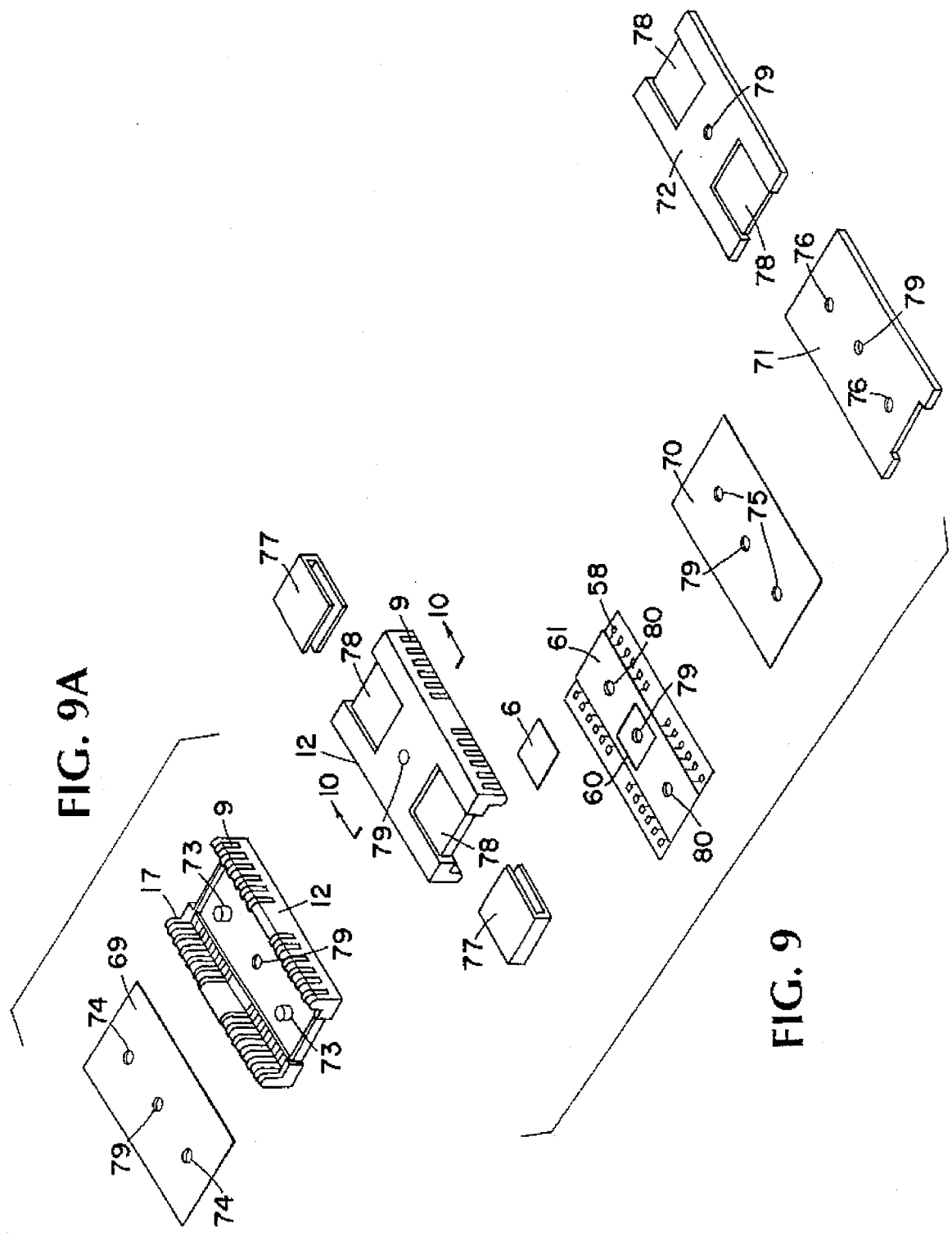

5,543,725

REUSABLE CARRIER FOR BURN-IN/TESTING ON NON PACKAGED DIE

BACKGROUND OF THE INVENTION

1. Field of the Invention

This invention relates to a carrier being provided with molded and plated or printed circuits for functional AC, DC as well as burn-in testing of bare or non-packaged circuit chips or die, i.e., non-packaged silicon die with circuitry. The carrier comprises a base with a cover or an integrated cover-base with a film construct.

The novel carrier has metallized contacts for making electrical connection between the bare die and the perimeter of the carrier. The circuitry for electrically connecting the die and the perimeter of the carrier can be molded and plated into the base or printed on polymeric film. The base or integrated cover-base of the carrier may be thermoplastic molded to conform to any intended package for the die, such as plastic Quad Flat Package (QFP), Leadless Chip Carrier (LCC), Small Outline "J" lead or any other intended package design. The object is to adapt the carrier to the existing test equipment for burn-in stress and electrical tests for the intended package design without having to modify the hardware, such as: the burn-in sockets, the circuit boards or the automatic test handler.

2. Description of the Related Prior Art

There is an increasing demand for new, electronic products which are smaller and lighter. As a result, there is an emerging demand for bare die that are completely electrical and burn-in tested. For example, smart cards are now as slim as the standard credit cards. The multichip module manufacturers design circuits stipulating several different types of chips having different functions to make a hybrid package. The smart card manufacturers and the makers of multichip hybrids require bare die instead of packaged die.

Users of bare die expect die suppliers to meet the stringent quality and integrity of packaged die. Thus, to ensure the quality, yield and reliability of bare die, semi-conductor or die suppliers are required by users to exercise the die by "burn-in" at elevated temperatures to reduce initial failure rate and to conduct final electrical testing to select the good die from the bad die.

The existing method of selecting functioning good die from bad die involves the use of a wafer probe. In wafer probing, electrical signals are sent to a test fixture containing several spring probe needles typically made of tungsten. Each probe is correspondingly aligned to each die pad and each die is individually tested on a wafer before cutting. Ideally, it would be desirable to have the testing of the uncut die on a wafer done at elevated temperatures. However, the thermal expansion of the spring probe needles of the probe tends to cause scrubbing and tearing of the bond pads on the die and cracking of its external protective coating. Therefore, burn-in testing using a wafer probe is limited in the temperature ranges that can be applied.

Some prior art approaches in mounting bare circuit chips on a module or carrier for burn-in or electric testing are described in U.S. Pat. No. 4,899,107: "Discrete Die Burn-In For Nonpackaged Die" and U.S. Pat. No. 5,123,850: "Non-Destructive Burn-In Test Socket For Integrated Circuit Die."

U.S. Pat. No. 4,899,109 discloses a reusable burnin/test fixture for discrete TAB die. The fixture comprises two parts: a die cavity plate to receive die as units under test and a probe plate where each probe is connected to electrical traces which terminate in fingers to accept a conventional card edge connector. The probes tips are metallic needles and protrude from the probe plate to contact the die pads. Thus, it suffers from the same problem as wafer probing. At high temperatures, due to thermal expansion the probe tips still cause scrubbing and tearing of the die pads, particularly when low contact resistance is maintained.

U.S. Pat. No. 5,123,850 describes a burn-in test socket for integrated circuit die. The socket comprises three parts, a metal base with a flexible film probe head, a pin grid array package attached to the probe head and a clamp to hold the device in place. The socket is suitable for testing a plurality of die, a wafer or hybrid packaged die. The flexible film probe head is formed from film coated aluminum, from which aluminum is partially removed by etching. The pads and traces are provided by electroplating. A clear elastomer is poured into the back of the film and cured. Thus, the film probe head is very complicated and is produced by a very complicated process. Moreover, the members of the socket must be aligned properly for it to function.

SUMMARY OF THE INVENTION

The carrier of the present invention overcomes these problems of the prior art non-packaged die carriers for burn-in or electrical testing by providing safeguards for the protection of the bond pads of the bare die against such scrubbing or tearing. One of the safeguards includes providing a flexible molded and metallized probe head in the carrier for contacting the bond pads. Such a probe head is less subject to thermal expansion. Alternatively, the carrier circuit provided as a printed circuit on a film construct which also is less subject to thermal expansion. Thus, scrubbing or tearing of the bond pads of the die are avoided. Further, according to the present invention, testing can be performed on each single cut-out die instead of a wafer of uncut die and the problem of cracking of the external protective coating is reduced. In principle, the carrier of this invention for testing a die comprises a thermoplastic molded base and a cover or a thermoplastic molded integrated cover-base with a film construct. The cover for the molded base may also be provided with a heat sink to allow heat dissipation from the die.

The base or the film construct is provided with a well to hold the die and circuitry molded and plated into the base or printed onto the film construct. The base or integrated cover-base of the carrier may be entirely injection molded from thermoplastic. The base is provided with a cavity or well or the integrated cover-base together with the film construct provides a cavity or well to allow a pick and place machine to drop the die into the well with the circuit pattern facing downward. The base or integrated cover-base of the carrier is provided with an indicator to assist the machine in orientating the die. Circuitry is provided to connect the bond pads of the die to the external perimeter of the carrier for electrical testing. In the embodiment using a molded base, a three dimensional circuit pattern is laid out on the molded base in metallized recessed grooves, curves or vertical walls of the molded base by utilizing the PSP™, Mold-n-Plate™, and Mask-n-Add™ processes which are part of Kollmorgen Corporation's patented KOLMOLD™ interconnection system. See Canadian Patent Nos. 1,255,810 and 1,284,862 each of which is incorporated herein by reference. In the embodiment using a film construct, the circuit may be photoprinted on film by well known processes, and connections to the perimeter of the carrier provided by using the PSP™, Mold-n-Plate™, Mask-n-Mold™ processes of the KOLMOLD™ interconnection system described in the Canadian Patents listed above. The pattern of the circuit is designed to electrically connect the probe heads or contact pads, which are in contact with the bond pads of the die, to the perimeter of the carrier for burn-in or electrical testing. The bottom of the base may be provided with a plate permanently sealing the cavity or well to prevent the entry of foreign particles into the die. Whereas, the integrated cover-base acts a seal for the cavity or well.

The molded base or integrated cover-base can be shaped to conform to any package type. Thus, the carrier of the present invention may be directly plugged into a burn-in socket or inserted onto an automatic test handler.

In a preferred embodiment of the present invention, the cover is a spring catch to assemble a separate heat sink with the carrier. In a more preferred embodiment, the integrated cover-base of the carrier also acts as a heat sink. When the cover is mounted onto the molded base, or when the film construct is placed on the integrated cover-base, circuits laid between the metallized probe heads of the thermoplastic injection molded base or contact pads of the film construct to the perimeter of the molded integrated cover-base to carry the electrical signals between the bond pads of the die to the perimeter of the carrier. Each probe head of the base or contact pads of the film construct is designed to align with a bond pad wherever located in the die. For example, in the carrier with a mold base, the probe heads may be placed to align with the bond pads located in the middle of the die. Each of the probe heads is cantilevered to ensure that there is a sufficient biasing force to make a tight contact with each bond pad of the die. The probe heads may be designed to be as close as 4 mils apart from each other. The metallized tips of the probe head may be gold plated to ensure good reliable contact with the bond pads. In the film construct with an integrated cover-base, the circuit and contact pads may be photoprinted onto the film. The contact pads may be placed very closely together, as low as 2 mils apart, and gold plated to ensure good reliable contact with the bond pads of the die. Following burn-in and electrical testing, the die is removed by an automatic pick and place machine. The fully burned-in and tested good die is then ready for application.

One of the novel features of the present invention is that the thermoplastic molded base or the integrated cover-base of the carrier could be shaped to conform to any type of intended packaging of the die. In the drawings, carriers are shown for a Small Outline "J" lead (SOJ) and a Leadless Chip Carrier (LCC) package. The carrier which is designed to conform to an intended package design can be plugged into a conventional burn-in socket for environmental stress testing followed by electrical testing on an automatic handler as desired.

According to one aspect of the present invention, there is provided a re-usable carrier for mounting a non-packaged die for testing comprising: (a) a molded base with a cover or a film construct with an integrated cover-base containing a cavity or well for receiving the non-packaged die; and (b) a circuit on the molded base or in the film construct electrically connecting the bond pads of the non-packaged die to the external perimeter of the base. The base is provided with a cover or the cover integrated with the base as an integrated cover-base for holding the non-packaged die in place in a cavity or well while maintaining connection between the bond pads of the non-packaged die and the external perimeter of the base via the circuit provided. The circuit may comprise a three dimensional circuit in the molded base with metallized recessed grooves and/or protruding metallized lines or the circuit may be photoprinted on the film construct.

The film construct provides a further advantage in that it provides more flexibility. In this embodiment a die can be mated with a cover-base which corresponds with any package design for testing, and the circuitry to connect the die and the test equipment can simply be photoprinted on film without using the more complicated mold and plate processes.

Other objects and advantages, which will become apparent, reside in the detailed construction of the carrier which is more fully hereinafter described and claimed, with reference to the accompanying drawings.

BRIEF DESCRIPTION OF THE DRAWINGS

FIG. 9 shows an exploded view of a SOJ package type using a single sided film construct with its component parts;

FIG. 9A shows the details of the reverse side of the molded cover base 12;

DETAILED DESCRIPTION OF THE EMBODIMENTS OF THE INVENTION

Figure 1:
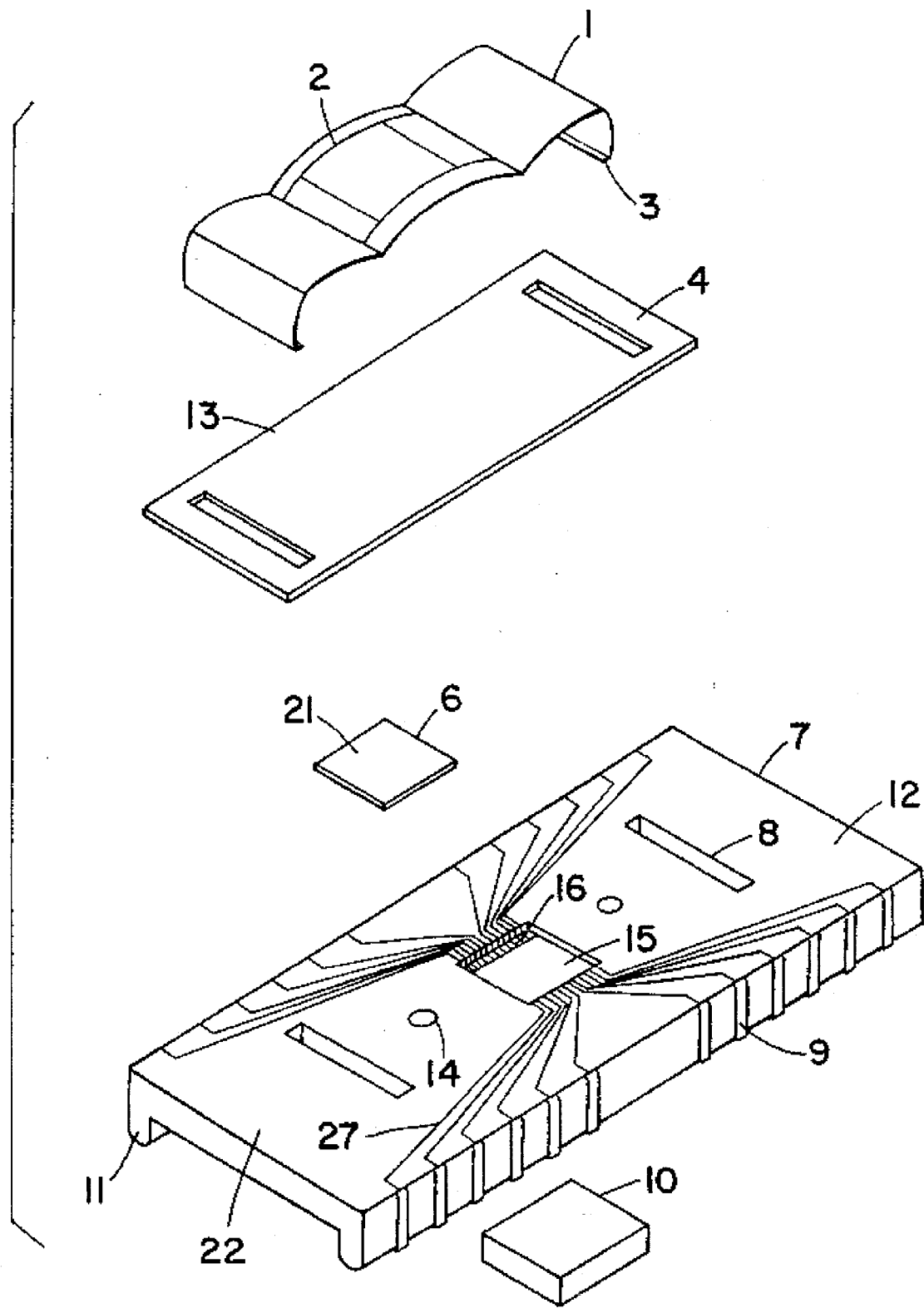
FIG. 1 is an exploded view of a preferred embodiment of the invention.

Referring now to FIG. 1, which shows one embodiment of the present invention, there is illustrated a thermoplastic injection molded base with a well 15 in which die 6 is placed and held. An indicator ensures the correct orientation for the loading of the die. The recessed circuit 27 converges at well 15. In well 15, cantilevered probe heads shaped like pyramids are positioned to align with the bond pads of the die. Bottom plate 10 provides a permanent cover to prevent entry of foreign particles to contaminate the die. In FIG. 1, the cover 1 is a spring catch and holds the assembly together with catch 3. Location holes 14 help locate heat sink 13 which also acts as a pressure distribution plate. Two studs 28 (shown in FIG. 2) are provided on the under side of heat sink 13. The ends of the catch 3 penetrates apertures 4 in the heat sink and slots 8 in the thermoplastic molded base to hold the assembly together.

Figure 1B:
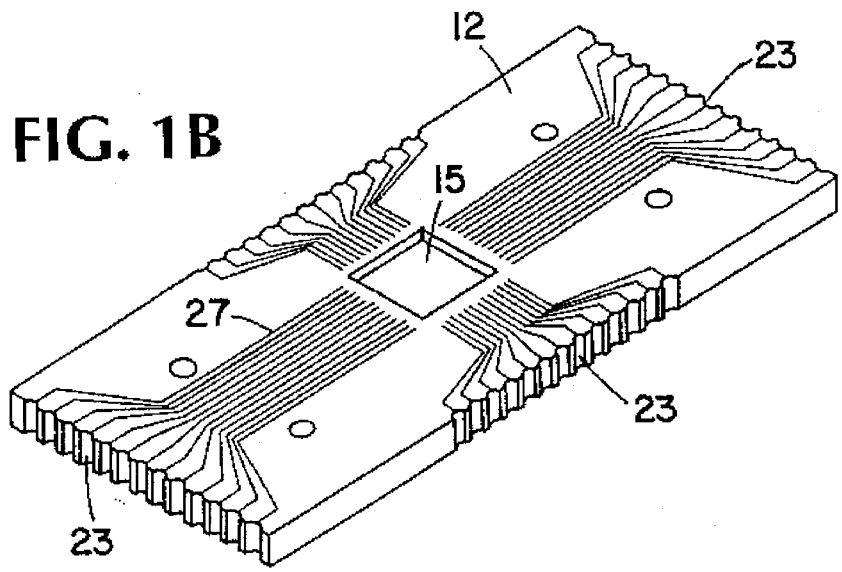
FIG. 1B illustrates the base in LCC package type.
Figure 1C:
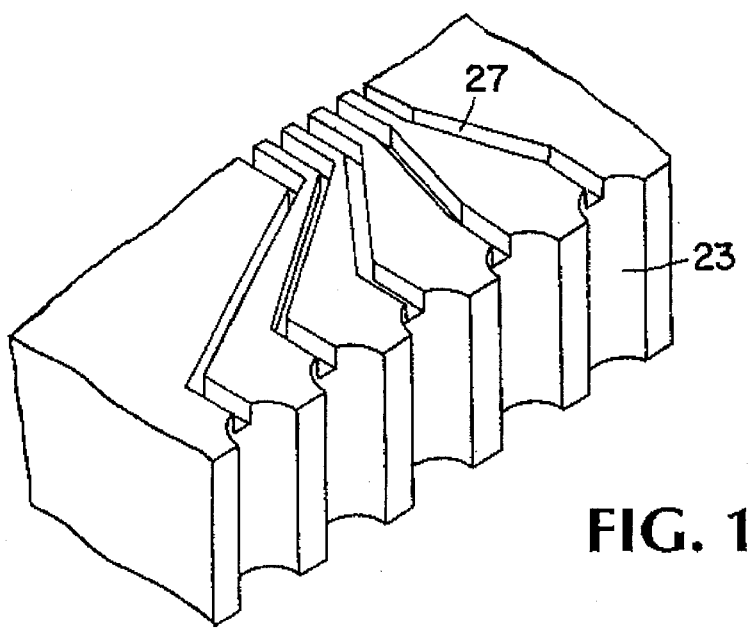
FIG. 1C shows an enlarged view of the LCC contact lead area.
Figure 1A:
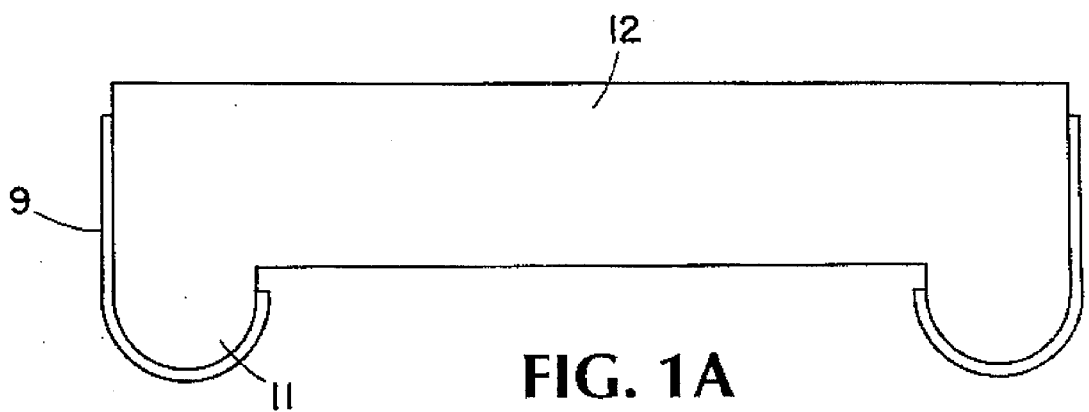
FIG. 1A shows an end view of a molded base in SOJ package type.

The metallized circuitry recessed on surface 27 is reversed to protrude at the edge of the molded base 11. The protruding metallized circuitry 9 is formed on the surface of the molded base as illustrated in FIG. 1A for a SOJ package. In FIG. 1B the connecting circuit is provided in the recessed grooves 27 which fan out to the four edges of the molded base to continue in recessed grooves which are semicircular in shape like that of an LCC package. The semi-circular grooves 23 shown in FIG. 1C are suitable for use for electrical testing of the die for an LCC package.

Figure 2:
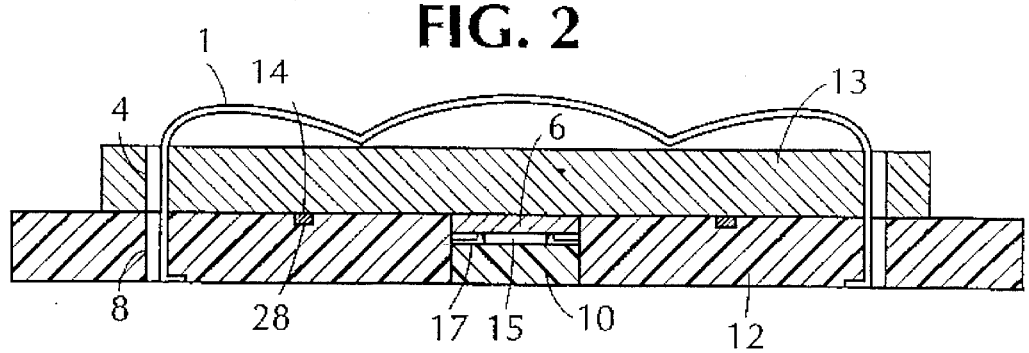
FIG. 2 shows a cross-sectional view of the assembled carrier of the preferred embodiment and the die.
Figure 3:
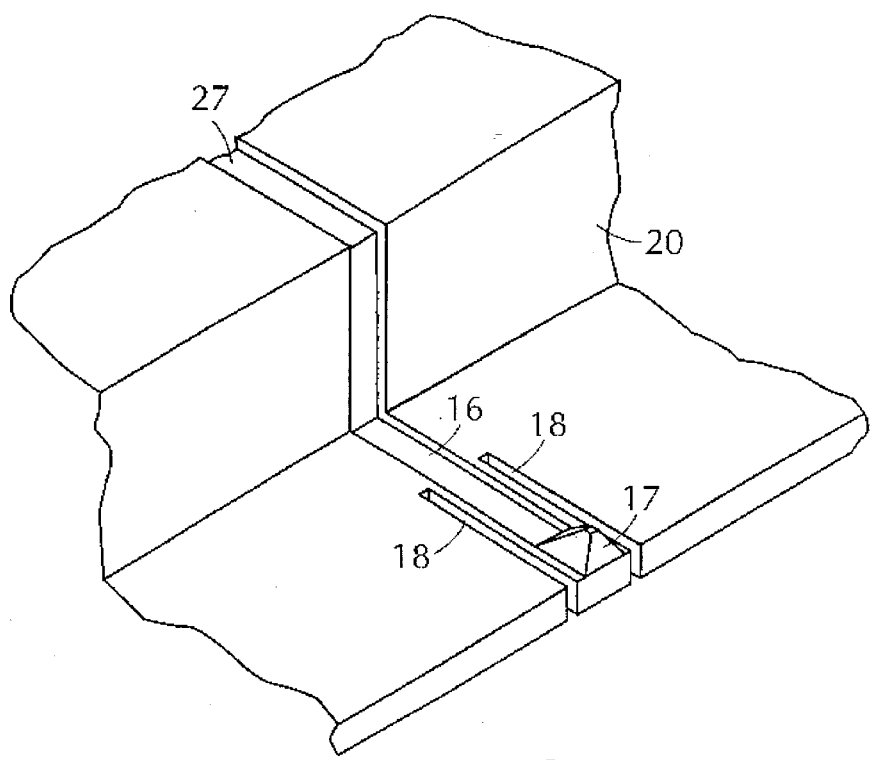
FIG. 3 is a prospective view showing the details of a single probe head in the cavity or well of the molded base.

FIG. 2 shows a cross-sectional view of an assembled carrier with the die 6 in the well 15. The die is seated so that the bond pads are aligned with the probe heads 17, a close-up view of which is shown in FIG. 3. Metallized groove 16 is recessed in molded base 12. Bottom plate cover 10 seals the well permanently.

In FIG. 3, each of the cantilevered probe has a protruding pyramid shaped head to provide more effective contact with each bond pad of the die. The cantilever action is achieved with slits 18 which provide proper biasing force and avoid possible co-planarity with the bond pads on the die. The probe, which is in metallized groove 16, is positioned lower than the surface of the thermoplastic injection molded base so that the die surface is prevented from making contact with the surface of the thermoplastic injection molded base. This is especially so at wall 20 of die well 15. Here, only the plated protruding pyramid heads make contact with the bond pads on the die. Because the base is molded from thermoplastic and the film is made from polymeric materials, there is less thermal expansion at high temperatures. Moreover, only the probe tips of the probe head or the contact pads of the film construct are in contact with the bond pads of the die, scrubbing and tearing of the bond pads are avoided. Also, because the cover holds a heat sink or the integrated cover-base acts as a heat sink and each die is tested singly, the temperature is more evenly distributed on the die and cracking of the external protective coating on the die is reduced.

Figure 4:
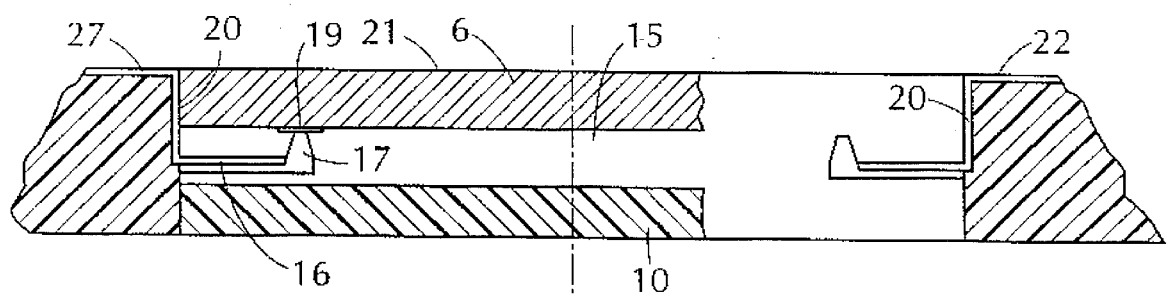
FIG. 4 is a cross-sectional view of the die well and the die bond pads in contact with the probe head.

FIG. 4 is a cross-sectional view of the die well 15 and a die 6 with bond pads 19 in contact with the protruding pyramidal probe heads 17. The die surface 21 protrudes slightly above the upper surface when spring catch 1 is mounted on the assembly. This provides a clamping pressure which is transmitted to the cantilevered probe heads.

Figure 5A:
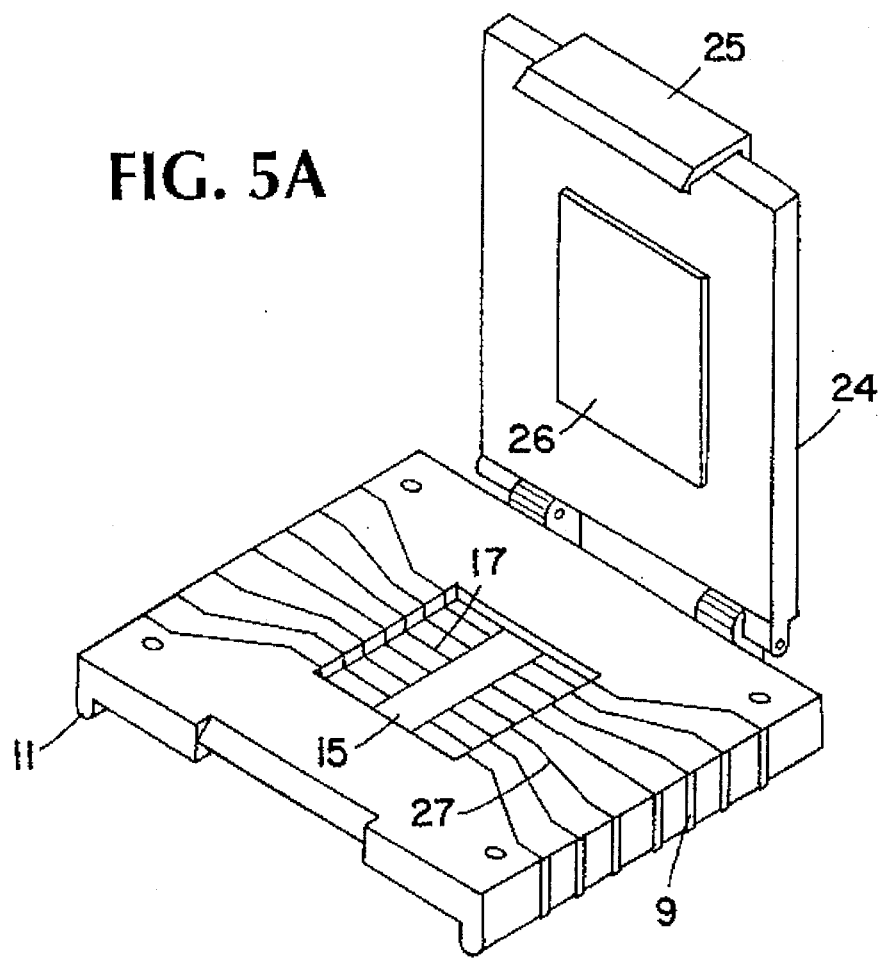
FIGS. 5A and 5B illustrate another embodiment of the cover wherein a hinge is used in place of a spring catch.
Figure 5B:
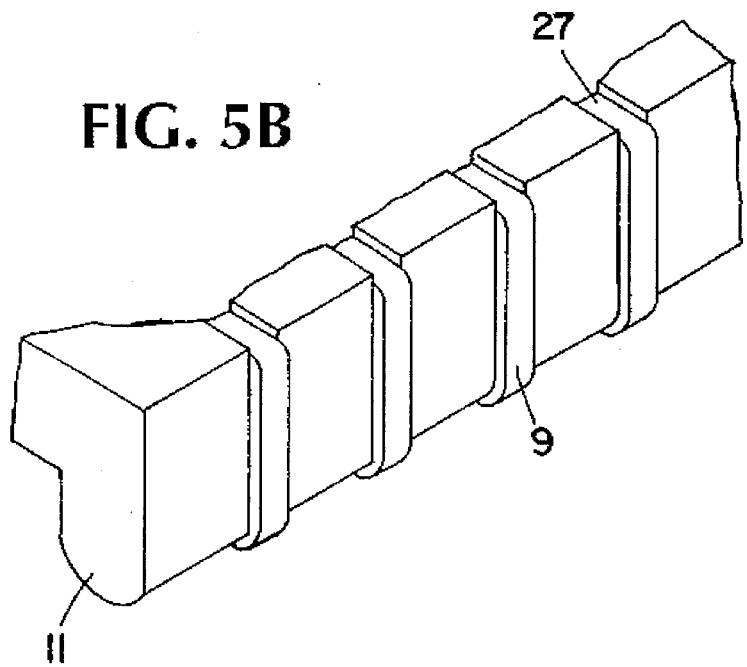
Figure 6A:
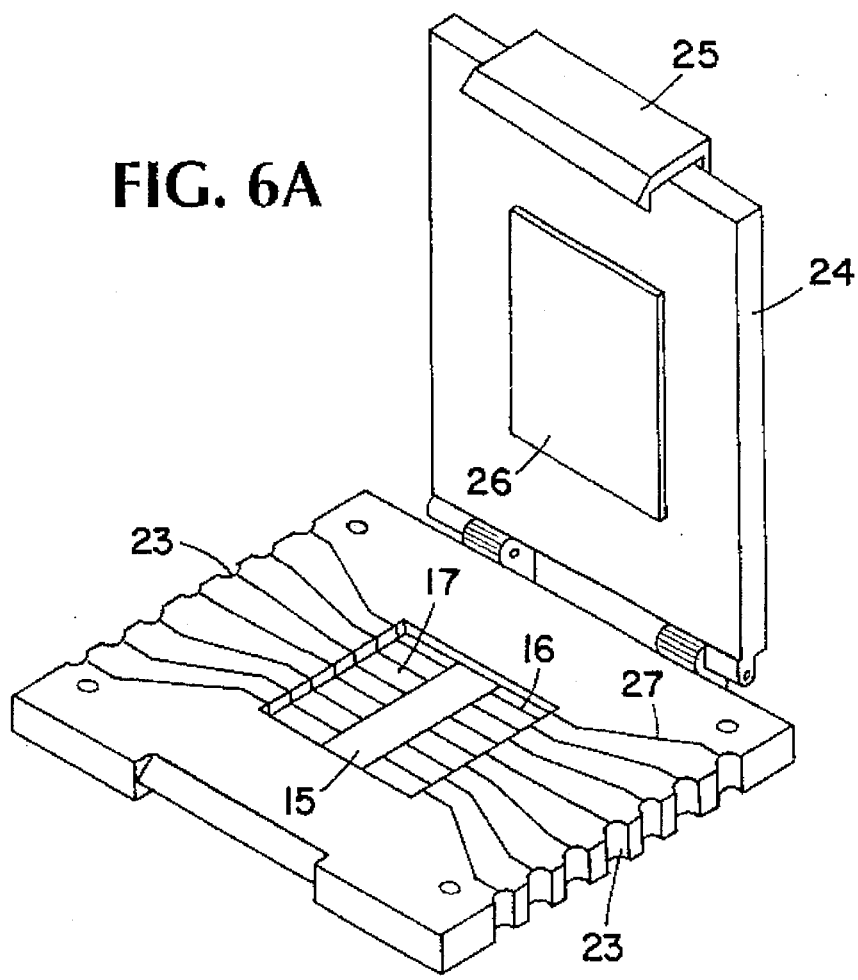
FIGS. 6A and 6B show a molded base in LCC package type using a hinged cover.
Figure 6B:
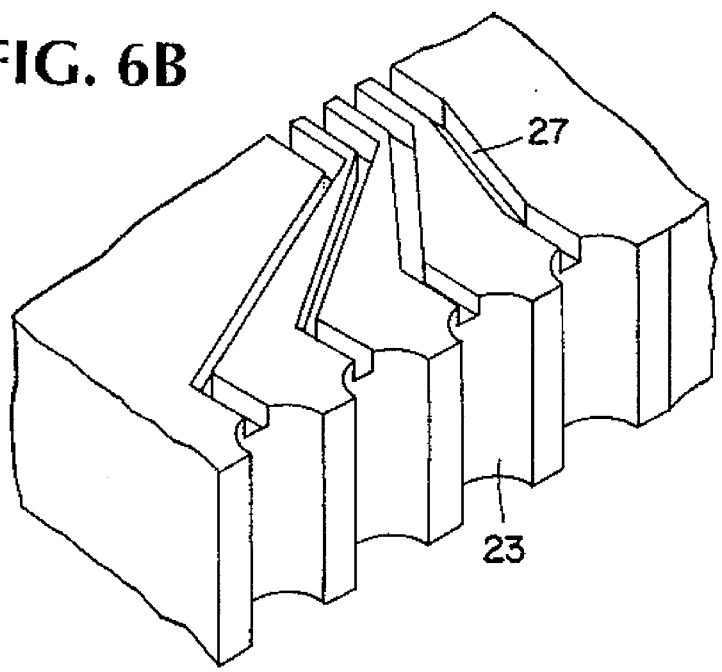

FIGS. 5A and 5B illustrate another embodiment using a hinged cover 24 to replace the spring catch cover of FIG. 1. Here, the hinged cover also acts as a heat sink, and spring clamp 25 is used to apply and distribute the pressure evenly over the die. This embodiment allows easy access for loading and unloading the die. In this illustration, the base is molded to conform with the SOJ package shape, and provided with metallized circuitry 9 along edge 11, protruding therefrom for electrical testing. The probe head 17 is positioned in this illustration to be near the centerline of the die well 15. This arrangement caters to those dies with bond pads arranged along the middle of the die. FIGS. 6A and 6B show a carrier with an LCC designed base with semicircular grooves 23 along the edges and circuitry for electrical testing.

Figure 7A:
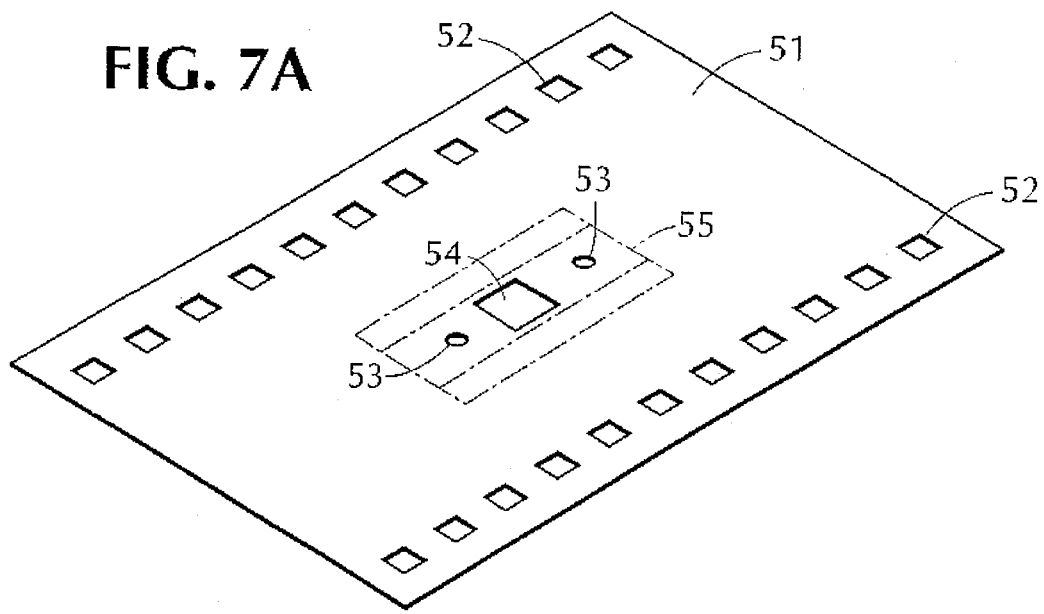
FIGS. 7A, 7B and 7C show the construction of a single sided printed film construct.
Figure 7B:
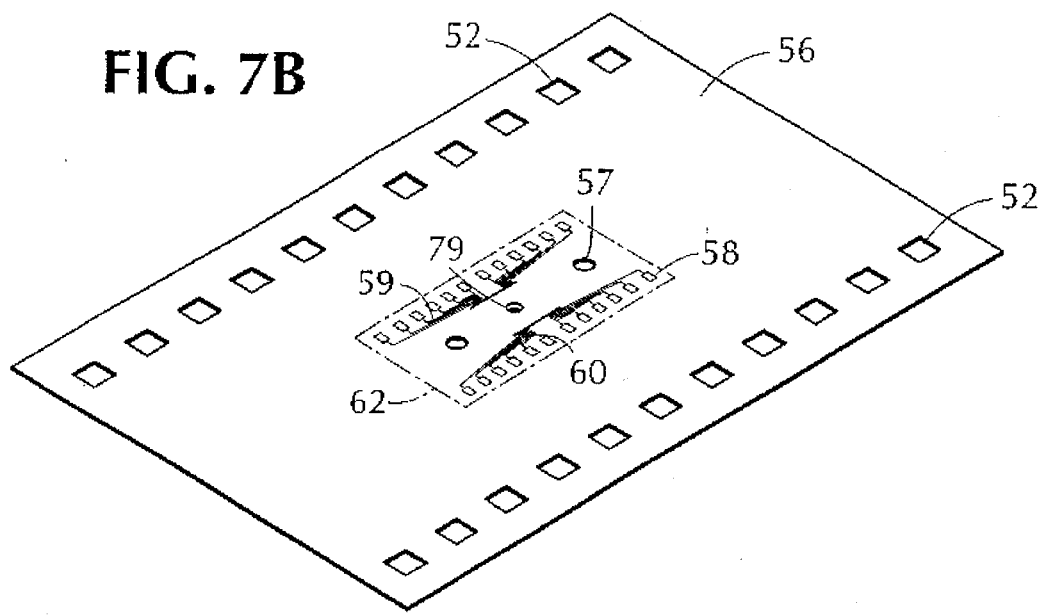
Figure 7C:
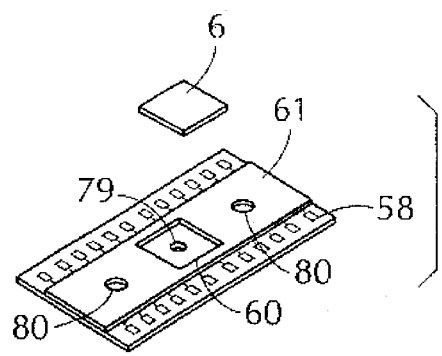
Figure 8A:
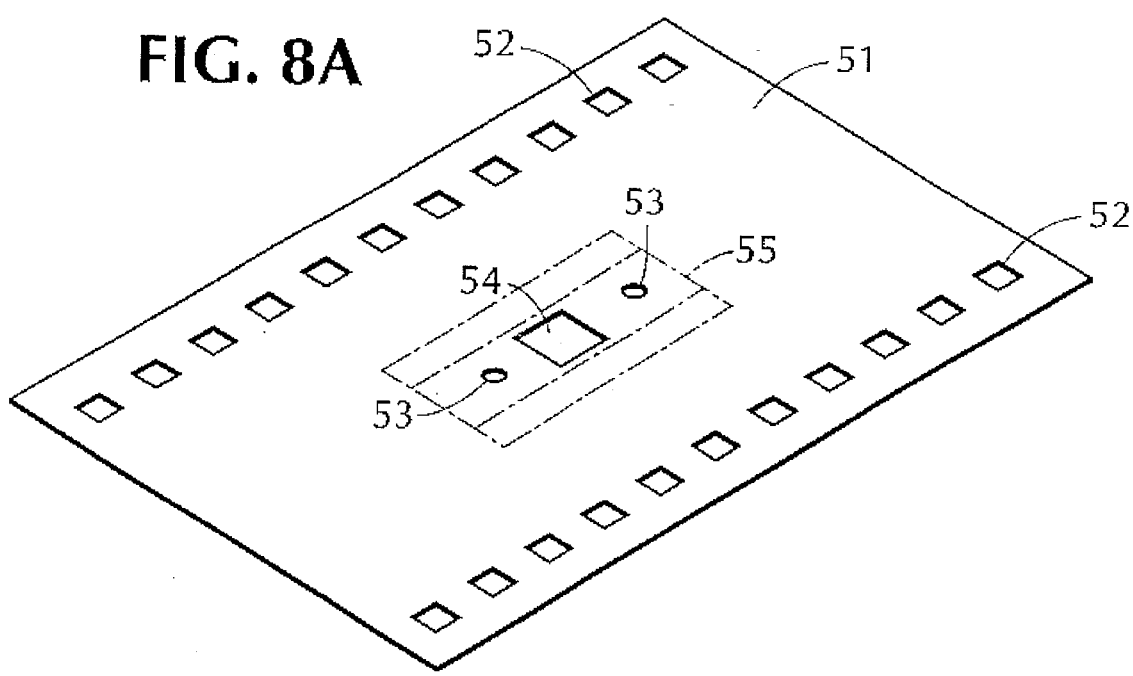
FIGS. 8A to 8E show the construction of a double sided printed film construct.
Figure 8B:
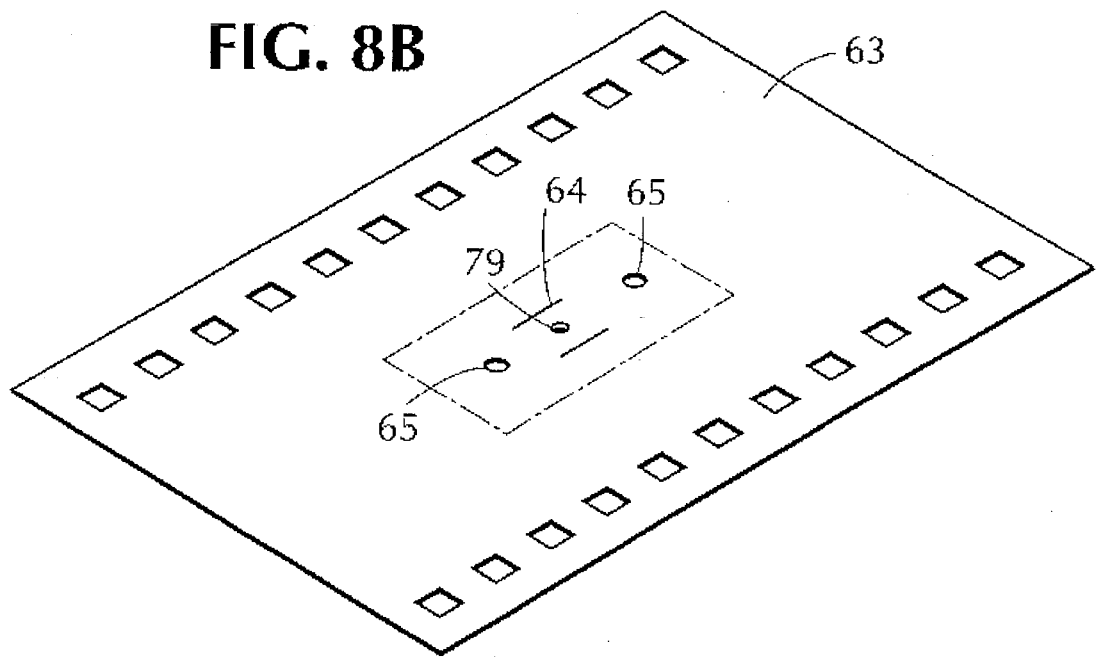
Figure 8C:
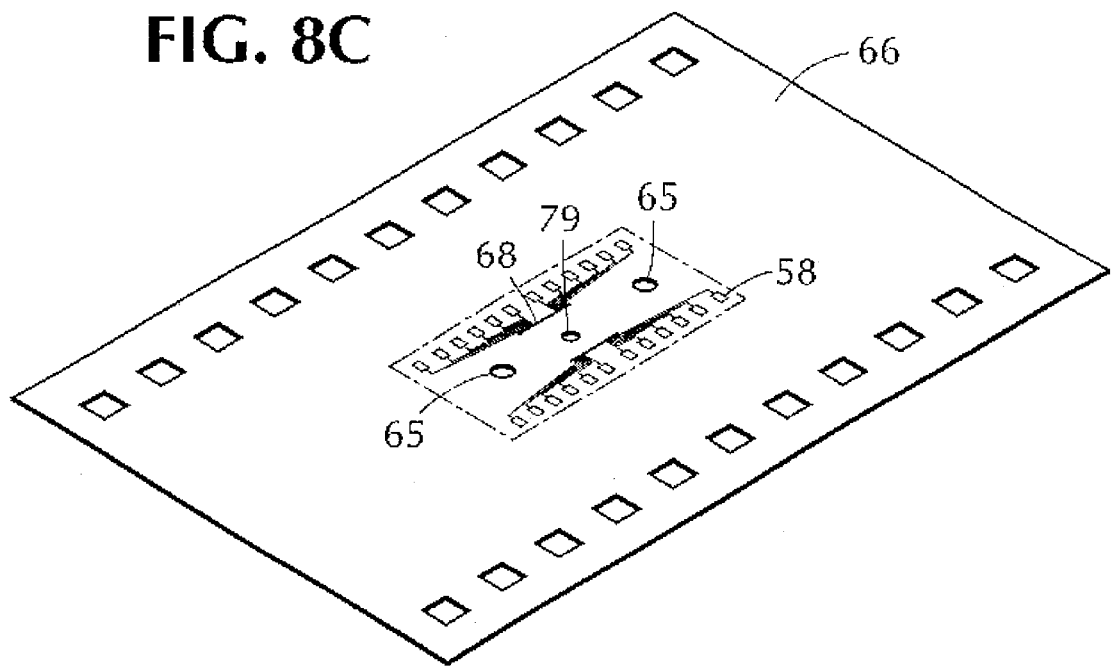
Figure 8D:
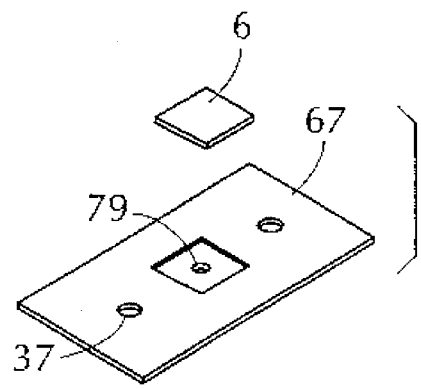
Figure 8E:
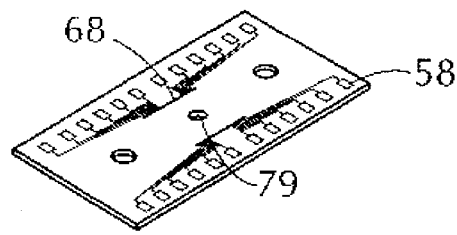

FIGS. 7A, 7B and 7C show a single sided film construct before and after assembly into the carrier. The film construct is made from 35 mm polyamide film or an equivalent manufactured by 3M, Du Pont or Sumitomo. FIG. 7A shows a die well film of the carrier constructed from film with a pre-cut die well. There are two alignment holes 53 for aligning the entire carrier assembly 61. The thickness of the film corresponds with the die which is designed to sit in the film well.

FIG. 7B shows a single sided film 56 with a printed pattern 59 thereon. The printed circuit is provided with a mask of appropriate thickness so that only contact pads 60 to the bond pads of the die and the contacts pads 58 to the contacts on the molded cover-base are exposed. There are two alignment holes 57 for assembling the film construct to the cover-base. Connections with bond pads are provided by printed fanned out traces 59 to the cover-base contacts 58. Pre-cut lines 62 show the border of the film construct 61. The contact pads 58 and 60 are electroplated with gold making a bump on each contact pad, the tips of the bumps being above the mask layer thickness. FIG. 7C shows the assembly of the film construct 61. Die well film 51 and film 56 are ultrasonically welded together. Registration of the two film layers is important and is achieved using the sprockets on the sides of the film before the film construct assembly 61 is cut out.

FIG. 8 shows a double sided film construct at its component level. It is basically the same as the single sided film construct except the "through hole" process is used here to connect a printed circuit on one side of the film to the printed and electroplated contact pads on the other side of the film. FIG. 8A is similar FIG. 7A. FIG. 8B shows side of the film with contacts to the bond pads. Contact bumps on the through hole 64 are aligned with the bond pads on the die 6. Through holes 64 are made by laser and are plated through. Bumps are formed on the plated through holes 64 to provide contacts to the bond pads of the die. FIG. 8C shows the opposite face of the film. Traces are laid to fan out from the bond pad contact pads 64 to the cover-base contact pads 58 which are provided with higher pitch. FIG. 8D shows the orientation of the film construct with the circuit side facing down. FIG. 8E shows the details of the film construct with the circuit side up, the reverse side of FIG. 8D.

FIG. 9 is an exploded view of the assembly for a single sided film construct with a molded cover-base, molded to conform to the intended packaging for the die. Two metal clips 77 hold the assembly together and provide contact pressure. Clips 77 and slots 78 are flushed to enable a SOJ type molded cover-base to be used on an existing test socket or machine. Positioning and alignment of all parts are made by mating holes 74, 75, 76 and 80 on the various components with studs 73 of the carrier base. Die removal is aided by hole 79. FIG. 9A shows the details of the reverse side of the molded cover-base 12. High thermally conductive silicon rubber 69 is located by mating holes 74 on the silicon rubber to studs 73 on the molded cover-base. Silicon rubber is used because it is soft and elastomeric and can take up slack to even out the contact pressure.

Figure 10:
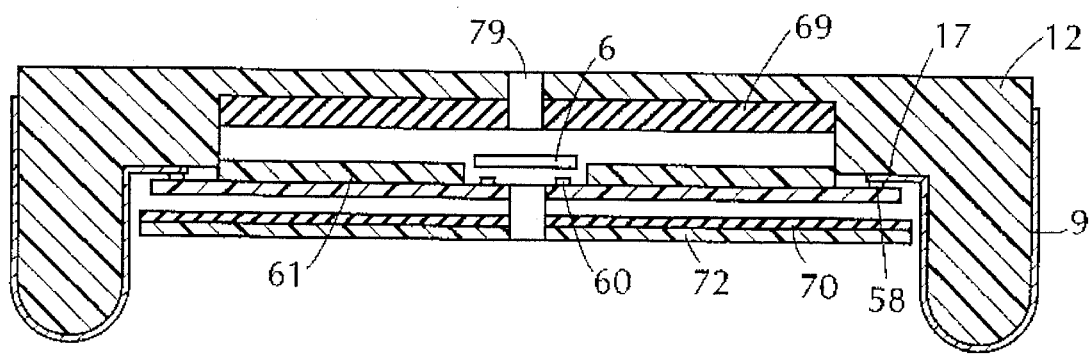
FIG. 10 shows a sectional view of a carrier for an assembled SOJ package.

FIG. 10 shows a cross-sectional view of the assembled cover-base in FIG. 9 through section B–B. Die 6 is sandwiched between thermally conductive rubber layers 69 and 70. Flexible silicon rubber is used to distribute the contact pressure when clips 77 are applied. Die removal is aided by hole 79. Electrical connection between the bonds pads on the die 6 to the perimeter of the cover-base is through contact pads 60 connected through the printed traces to contact pads 58 on the film and 17 on the integrated cover-base. The shaded portions show protruding traces 9 and the manner in which electrical connection to the test equipment can be achieved.

Figure 11:
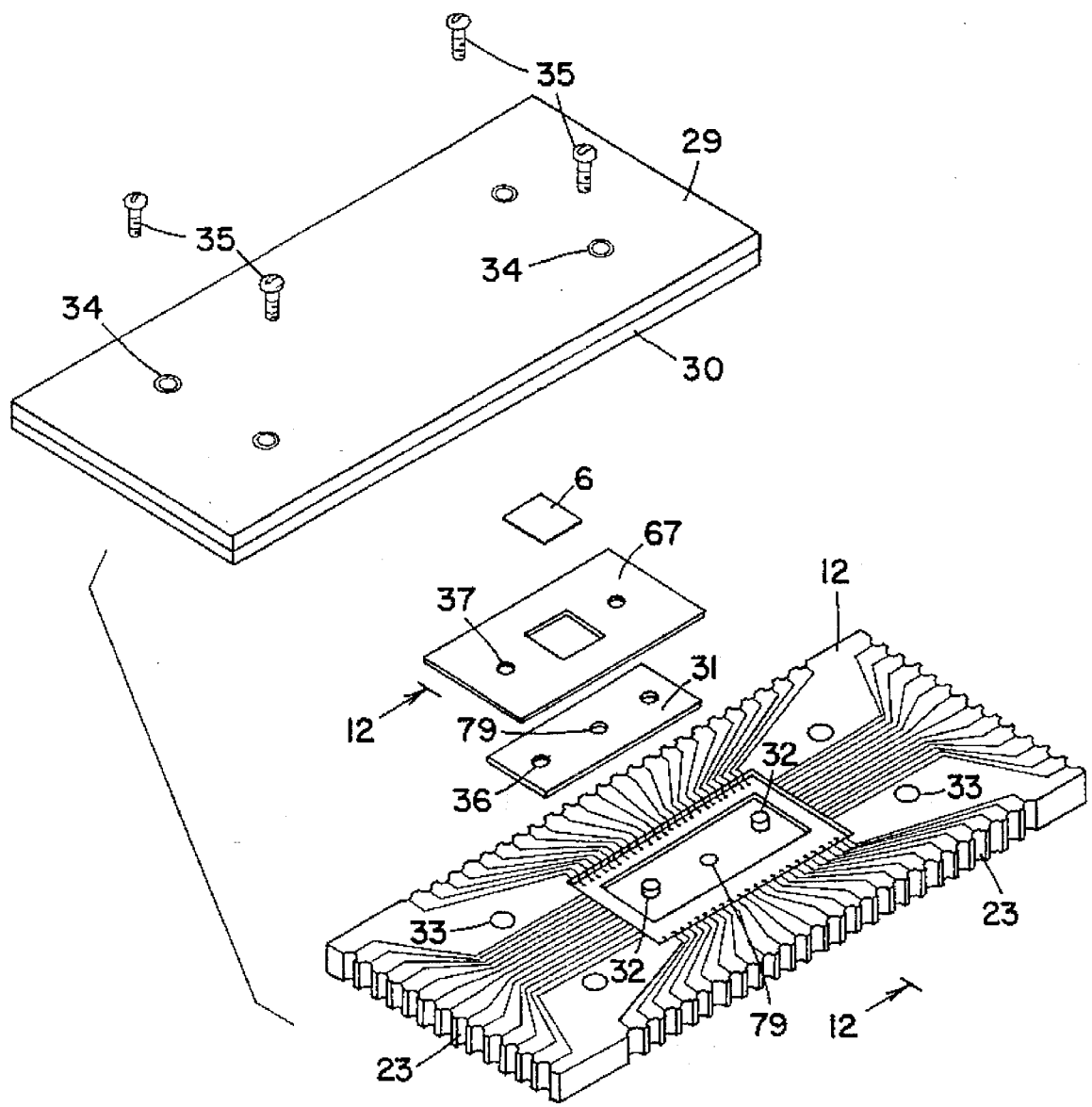
FIG. 11 is an exploded view of a carrier for a LCC package.

FIG. 11 shows a four sided LCC molded cover-base for a film construct. The double sided film construct for this embodiment has less contact requirement than that of the edges of a LCC package. The careful matching of the bond pads on the die, film contact pads and the contacts on the molded cover-base, allows flexibility and re-use of the molded cover-base carrier without frequent re-tooling Pressure is evenly exerted by attaching a pressure plate 29 with a layer of highly thermal conductive silicon rubber 30 to the molded cover-base with four screws 35.

Figure 12:
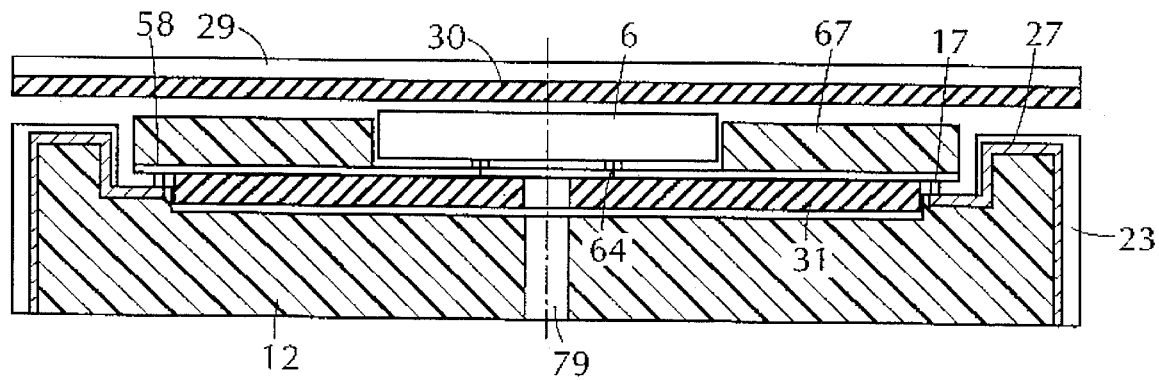
FIG. 12 is a sectional view of a carrier for an assembled plastic Leadless Chip (LCC) package.

FIG. 12 shows a cross-sectional view along the line A—A of an assembled cover-base carrier wherein recessed connection 27 is shaded. Silicon rubber packings 30, 31 are also added to take out slack and provide flexibility.

The many features and advantages of the invention are apparent from the detailed description of the embodiments. It is intended by the appended claims to cover all of the features and advantages of the carrier assembly which fall within the spirit and scope of the invention. Numerous modifications and changes will readily occur to those skilled in the art, and is not to be limited to the construction and operation shown and described. Accordingly all suitable modifications and equivalents may be resorted to and considered to be falling within the scope of this invention.

What is claimed is:

1. A reusable carrier for mounting a non-packaged die for burn-in and testing comprising a molded plastic base having a configuration and an outer perimeter conforming to a desired integrated circuit package design for a standard industrial package design, said base including means for receiving and positioning on the molded plastic base a non-packaged die having bond pads, said base also including integrally formed pin terminals positioned on the outer perimeter to mate with the pin terminals of an intended integrated circuit design, an thin layer electrically conductive material coated on the integrally formed pin terminals of the base to form an outer pin circuitry for enabling electrical contact of the integrally formed pin terminals with existing test equipment, molded plastic means extending from the outer perimeter circuitry to the die receiving means, and including thin layer electrically conductive material coated on the molded plastic means for enabling electrical connection between the outer perimeter circuitry and bond pads of a received non-package die, a cover removably mounted on the molded base for holding the non-package die and imparting desired pressure for maintaining connection between the bond pads of the non-packaged die and the circuitry extending along the base to the outer perimeter circuitry, and means for detachably holding the cover to the molded base, wherein said cover, plastic molded base and said cover holding means form a carrier having a shape and dimension substantially conforming to the intended integrated circuit package design so as to allow use with existing test equipment.

2. A reusable carrier according to claim 1 wherein said die receiving means forms a well in which the non-packaged die is received, wherein said molded plastic means extending from the outer perimeter circuitry to the die receiving means comprises a plurality of probes positioned around the perimeter of the well to contact with the bond pads of a non-packaged die during testing.

3. A reusable carrier according to claim 2 wherein the probes are cantilevered to ensure reliable contact with the bond pads of the die.

4. A reusable carrier according to claim 1 wherein the molded base is molded to conform to the shape of packaging for a currently available die.

5. A reusable carrier according to claim 1 including a shield to protect dirt from getting on to the circuitry of the non-packaged die.

6. A reusable carrier according to claim 1 including an indicator on the molded base for guiding the orientation of the die.

7. A reusable carrier according to claim 1 including a heat sink allow improved heat dissipation during burn-in testing.

8. A reusable carrier for mounting a non-packaged die for burn-in and testing comprising a molded plastic base having a configuration and an outer perimeter conforming to a desired integrated circuit package design for a standard industrial package design, said base including means for receiving and positioning on the molded plastic base a non-packaged die having bond pads, said base also including integrally formed pin terminals positioned on the outer perimeter to mate with the pin terminals of an intended integrated circuit design, an thin layer electrically conductive material coated on the integrally formed pin terminals of the base to form an outer pin circuitry for enabling electrical contact of the integrally formed pin terminals with existing test equipment, molded plastic means extending from the outer perimeter circuitry to the die receiving means, and including thin layer electrically conductive material coated on the molded plastic means for enabling electrical connection between the outer perimeter circuitry and bond pads of a received non-packaged die, a cover removably mounted on the molded base for holding the non-packaged die and imparting desired pressure for maintaining connection between the bond pads of the non-packaged die and the circuitry extending along the base to the outer perimeter circuitry, said cover also being formed of a material to dissipate heat and act as a heat sink, and means for detachably holding the cover to the molded base, wherein said cover, plastic molded base and said cover holding means form a carrier having a shape and dimension substantially conforming to the intended integrated circuit package design so as to allow use with existing test equipment.

9. A reusable carrier according to claim 8 wherein said die receiving means forms a well in which the non-packaged die is received, wherein said molded plastic means extending from the outer perimeter circuitry to the die receiving means comprises a plurality of probes positioned around the perimeter of the well to contact the bond pads of a non-packaged die during testing.

10. A reusable carrier according to claim 9 wherein the probes are cantilevered to ensure reliable contact with the bond pads of the die.

11. A reusable carrier according to claim 8 wherein the molded base is molded to conform to the shape of packaging for a currently available die.

12. A reusable carrier according to claim 8 including a shield to prevent dirt from getting onto the circuitry of the non-packaged die.

13. A re-usable carier according to claim 8 including an indicator on the molded base for guiding the orientation of the die.

\* \* \* \* \*